(12) United States Patent
Panning et al.

(10) Patent No.: US 7,316,893 B2
(45) Date of Patent: Jan. 8, 2008

(54) MODULAR CONTAINMENT CELL ARRANGEMENTS

(75) Inventors: Eric M. Panning, Portland, OR (US); Hok-kin Choi, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 1084 days.

(21) Appl. No.: 10/295,880

(22) Filed: Nov. 18, 2002

(65) Prior Publication Data

US 2004/0106048 A1 Jun. 3, 2004

(51) Int. Cl.
*G03C 5/16* (2006.01)
*H01L 21/00* (2006.01)

(52) U.S. Cl. .................. 430/322; 438/795
(58) Field of Classification Search ............... 438/795; 422/186.3; 204/157.3; 250/492.1, 492.2, 250/493.1, 496.1, 372; 430/311–317, 322

See application file for complete search history.

(56) References Cited

U.S. PATENT DOCUMENTS

| | | | | |
|---|---|---|---|---|
| 4,568,632 A | * | 2/1986 | Blum et al. ................. | 430/322 |
| 4,715,318 A | * | 12/1987 | Kameyama et al. ........ | 118/722 |
| 5,310,624 A | * | 5/1994 | Ehrlich ....................... | 430/322 |
| 5,815,330 A | * | 9/1998 | Becker ....................... | 359/886 |
| 6,506,665 B1 | * | 1/2003 | Sato ........................... | 438/458 |
| 7,025,831 B1 | * | 4/2006 | Butterbaugh et al. ....... | 118/724 |
| 2003/0015669 A1 | * | 1/2003 | Janos et al. ............. | 250/492.2 |
| 2004/0179178 A1 | * | 9/2004 | Emoto ........................ | 355/53 |
| 2005/0123288 A1 | * | 6/2005 | Ito et al. .................... | 392/418 |

OTHER PUBLICATIONS

Luxel Corporation, "Modeled Transmittance" [online] [retrieved on Apr. 19, 2007] <URL: http://www.luxel.com/transmitt.htm>.

* cited by examiner

*Primary Examiner*—Duane Smith
*Assistant Examiner*—Robert A Clemente
(74) *Attorney, Agent, or Firm*—Blakely, Sokoloff, Taylor & Zafman LLP

(57) ABSTRACT

Modular containment cell arrangements, including modular containment cells to contain an item and at least one processing material associated with processing of the item.

27 Claims, 2 Drawing Sheets

MODULAR CONTAINMENT CELL ARRANGEMENTS

FIELD

Embodiments of the present invention relate to modular containment cell arrangements.

BACKGROUND

There has been found a need in the item processing art to locally contain processed items, e.g., to prevent stray materials (contaminants) from negatively affecting processing equipment or processing items (e.g., wafers). Background and/or example embodiments of the present invention will use a semiconductor processing testing or experimenting with a new resist material (applied to a wafer as a substrate) and the application of extreme ultraviolet (EUV; wavelength in a range of 10 to 14 nanometers) processing light thereto as an explanation example. However, practice of the present invention is by no means limited thereto.

More particularly, in beginning discussion, an example experimental/test material (such as a new resist material) may release potential contaminants (e.g., gas(es), splatters, eruptions, etc.) therefrom when EUV and other processing conditions are applied thereto. Such contaminants may be released or ejected into the environment surrounding the material, such as into the internal chamber of a semiconductor processing machine (e.g., plasma processing machine). A problem with the aforementioned contaminants is that they have the potential to migrate, deposit on and/or contaminate other internal areas of the machine, and/or neighboring items (e.g., wafers).

Semiconductor processing machines tend to be expensive, intricate and difficult to clean. Unless the difficult cleaning is performed after contamination, a wide variety of subsequent problems may result. For example, deposited contaminants may cause permanent damage to the machine by chemical reactions such as etching. Expensive sensors within the machine may become permanently contaminated and damaged. As another example, residual contaminants within the processing machine may again become mobile during subsequent processing and may subsequently contaminate other items (e.g., semiconductor wafers, test materials, etc.) processed within the machine.

One example background approach to avoid the above-mentioned problems (with the present experimental/testing example) is to avoid experimenting/testing with the new materials within an actual (on-line) manufacturing semiconductor processing machine, and to instead have/use specialized testing machines/facilities which are dedicated to experiment/testing. For example, given the relatively low cost of UV light sources, an off-line UV testing machine/chamber may be built and used to process experimental/test materials.

A first disadvantage with this test machine/chamber approach is that it adds significant additional costs to manufacturing. A further disadvantage is that testing may be performed with unrealistic processing conditions that differ significantly from conditions that may exist within the on-line semiconductor processing machines. For example, an on-line manufacturing machine may have an internal chamber pressure of several atmospheres, whereas the testing machine might perform testing only at atmospheric pressure. As a result of differing conditions, unreliable test results may be obtained. For example, the test material may not result in any contaminants when processed at atmospheric pressure, but may release or eject significant contaminants when processed at several atmospheres of pressure.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
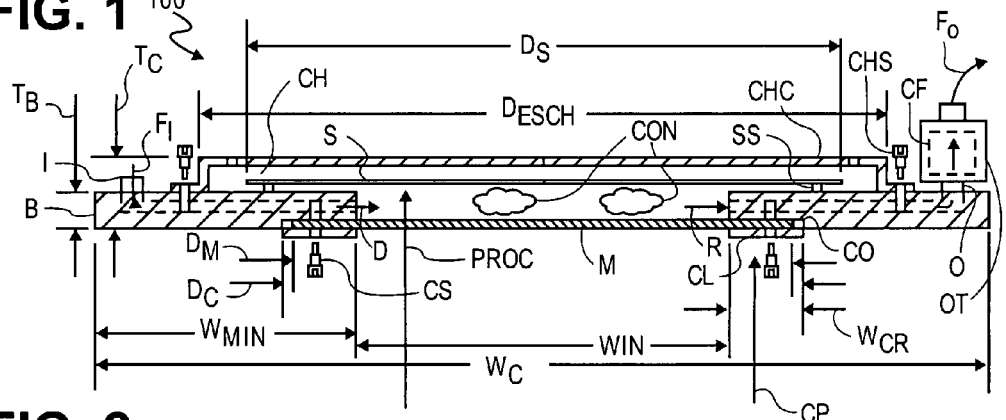
FIG. 1 is a side cross-sectional view of an example modular containment cell arrangement, useful in gaining a more thorough understanding/appreciation of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/materials/shapes may be given, although the present invention is not limited to the same. Well-known power/ground connections, controls, etc. to semiconductor processing machines and other components may not be shown within the FIGS. for simplicity of illustration and discussion, and so as not to obscure the invention. Further, arrangements may be shown in simplistic and/or block diagram form in order to avoid obscuring the invention, and also in view of the fact that specifics with respect to implementation of such arrangements are highly dependent upon the platform within which the present invention is to be implemented, i.e., such specifics should be well within purview of one skilled in the art. Where specific details are set forth in order to describe example embodiments of the invention, it should be apparent to one skilled in the art that the invention can be practiced with or without variation of these specific details.

Figure 2:
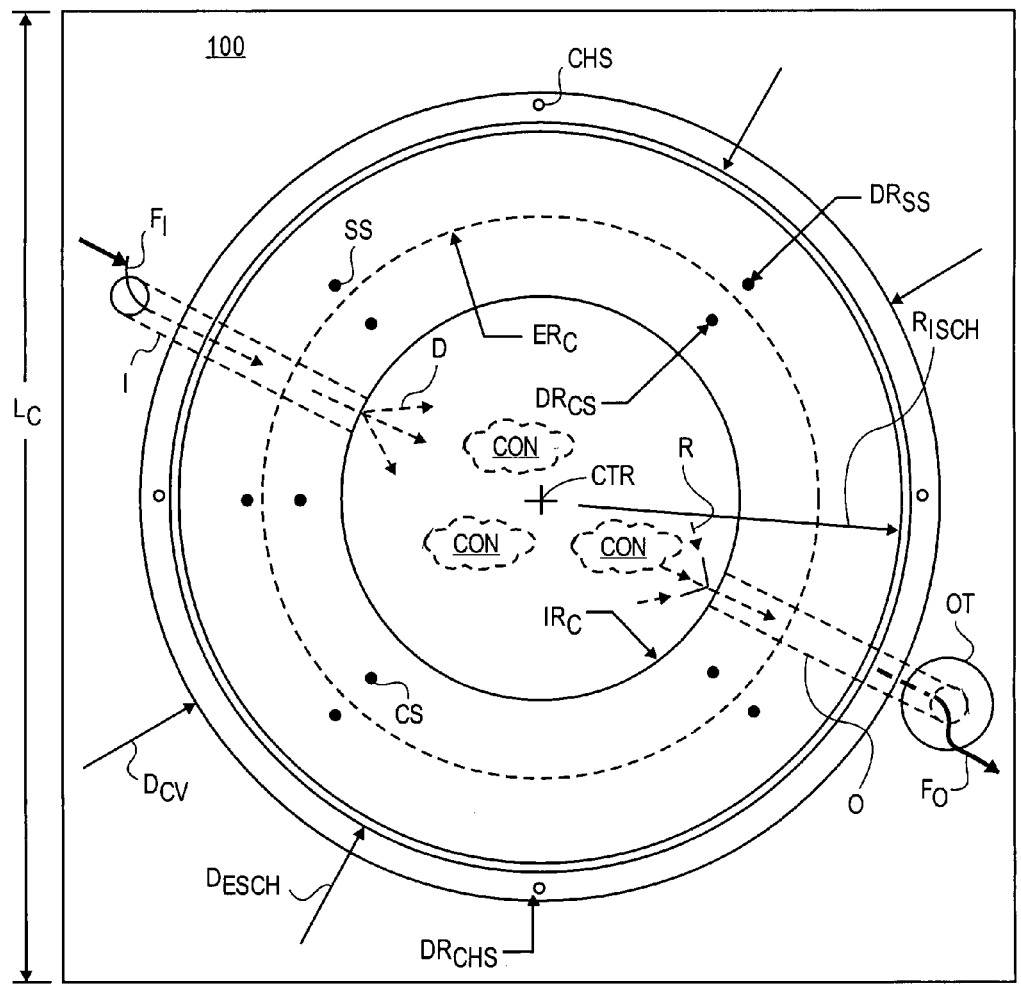
FIG. 2 is a partial cut-away top view of the FIG. 1 example modular containment cell arrangement, and is also useful in gaining a more thorough understanding/appreciation of the present invention.

FIG. 1 is a side cross-sectional view, and FIG. 2 is a partial cut-away top view, of an example modular containment cell arrangement 100. Both views are useful in gaining a more thorough understanding/appreciation of the present invention. More particularly, the containment cell 100 represents an example mechanical assembly designed for physical compatibility with, for example, existing 6.00" reticle holders in semiconductor processing machines, and has an EUV permeable replaceable window (e.g., membrane), and also provisions for containing/trapping contaminant components.

Figure 3:
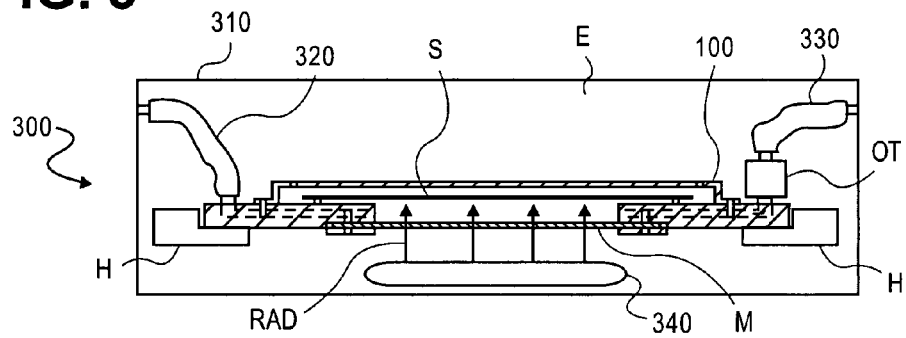
FIG. 3 is a side cross-sectional view of an example semiconductor processing machine including a processing chamber containing the FIG. 1 modular containment cell arrangement, and again is useful in gaining a more thorough understanding/appreciation of the present invention.

Included is a main cell body B which may, for example, be of a square shape, and may have, for example, a body thickness $T_B$ of 0.25", a cell width $W_C$ of 6.00", a cell length $L_C$ of 6.00", and a center CTR. Although not shown, the cell body may have some type of keying arrangement to key the cell body to a specific placement (orientation) with respect to the corresponding holder H (FIG. 3) or a processing machine 310 (FIG. 3).

The cell body B may also have an arrangement for mounting an item such as a processing substrate S, like a wafer, on a first side thereof using any viable mounting arrangement. One example mounting arrangement would be an example plurality of (e.g., 5) substrate screws SS, each having an example displacement radius $DR_{ss}$ of 1.8438" from the CTR. Four (4) of the substrate screws may be equally distributed (e.g., at 90 degree angles) along a periphery of the substrate, while the fifth screw may be used to key the substrate to a specific placement (orientation) with respect to the cell. The wafer may have an example substrate diameter $D_s$ of 4.0".

The cell body B may be made of any material providing suitable rigidity, such as a ceramic, glass, metal, plastic, etc. The cell body B and substrate screws SS may be made of materials that do not serve as a source of contaminants.

The containment cell 100 may further include, for example, a lipped chamber cover CHC mounted on a first side thereof using any viable mounting arrangement, so as to define a chamber CH for enclosing the item or substrate S therein. The chamber cover CHC may protrude above the cell body B at a distance of an example 0.25", while also having an example lip diameter $D_{CV}$ of 5.0", an example external substrate chamber diameter $D_{ESCH}$ of 4.6250", and an example internal substrate chamber radius $R_{ISCH}$ of 2.2500". One example mounting arrangement would be an example plurality of (e.g., 4) chamber cover screws CHS equally distributed (e.g., at 90 degree angles) along the lip of the chamber cover, with each screw CHS having an example displacement radius $DR_{CHS}$ of 2.4063" from CTR. An optional sealing arrangement (e.g., O-ring) may be provided between the mating surfaces of the chamber cover CHC and the cell body B, so as to create a hermetic seal therebetween.

The chamber cover CHC may be made of a material (e.g., resin, plastic, glass, etc.) that allows the transmission/application of processing conditions (e.g., UV light, radiation, etc.) therethrough, or may be made of a material (e.g., metal) not allowing the transmission of such processing conditions. The chamber cover CHC, sealing arrangement material, and the screws CHS, may be made of materials that do not serve as a source of contaminants.

The cell body B may have a window WIN defined therein to allow processing conditions PROC such as EUV light to pass therethrough (without traveling through the chamber cover CHC) so as to impinge on exposed surfaces of the substrate S. The cell 100 may further include a circular carve-out CO for mounting a removable membrane M therein on a second side of the cell body. An example EUV-permeable membrane may serve one or more of the following three purposes: 1) allow sufficient processing conditions PROC (e.g., EUV light) to pass therethrough to effect the desired processing of the substrate; 2) contain contaminants within the cell 100; and 3) capture at least a portion of the contaminants (e.g., for analysis).

The removable membrane may be made of materials that do not serve as a source of contaminants. As one viable example for semiconductor processing with EUV transmission, thin and commercially-available (e.g., Luxel™) polyimide membranes have been established for EUV spectral purity filter applications. That is, reference is made to "Experimental Evaluation of Candidate for EUV Membrane Filters" dated 30 Oct. 1997 (Sandia National Labs under LLC CRDA). Transmissions greater than 20% are workable for thin polyimide and metal coated polyimide films. This is more than sufficient for this application and for manufacturing throughput.

The window WIN may have a diameter (referenced from CTR), for example, of 2.50", such that the cell body B has minimum edge-to-WIN portions $W_{MIN}$ of 1.7500". The circular carve-out CO may have a diameter (referenced from CTR) of 3.60". The membrane M (shown in a removed state in FIG. 4) may have a diameter $D_M$ of 3.500", and may be held within the circular carve-out CO using an example clamping ring CL having a ring width $W_{CR}$, for example, of 0.50", an internal ring radius $IR_C$ (referenced from CTR), for example, of 1.25" (2.50" diameter) and an external ring radius $ER_C$ (referenced from CTR), for example, of 1.75" (diameter $D_C$=3.50").

The clamping ring CL may be clamped to the cell body B, for example, using a plurality of (e.g., 5) clamping screws CS, each having an example displacement radius $DR_{CS}$ of 1.5313" from the CTR. Four (4) of the clamping screws CS may be equally distributed (e.g., at 90 degree angles) along the clamping ring CL, while the fifth screw may be used to key the clamping ring CL to a specific placement (orientation) with respect to the cell. The clamping screws CS, when tightened, apply a clamping pressure CP so as to squeeze the membrane M against the cell body B. An optional membrane sealing arrangement (e.g., O-ring) may be provided between the mating surfaces of the membrane M and the cell body B, so as to create a hermetic seal therebetween.

The clamping ring CL may be made of any material providing suitable rigidity such as a ceramic, glass, metal, plastic, etc. Again, the clamping ring CL, membrane and membrane sealing arrangement may be made of materials that do not serve as a source of contaminants.

Overall, with the clamping ring CL and chamber cover CHC installed onto the cell body B, the modular containment cell arrangement 100 may have an example main thickness $T_C$ of approximately 0.5".

Returning to FIG. 4, which shows a view 400 of the example membrane M in a removed state, the membrane M may include pre-formed screw holes 402 and 404 at orientations/locations that match the orientations/locations of the clamping screws CS. Further, the membrane M may have, for example, a cured silicon rubber bead disposed adjacent the periphery thereof to serve as the aforementioned membrane sealing arrangement (as an alternative to the aforementioned O-ring).

In the present example, the substrate S may have the aforementioned example new resist material coated, for example, on a side thereof facing the cell body. During processing, processing conditions PROC such as EUV light pass through the membrane M to impinge onto exposed areas of the new resist material. During and/or as a result of processing, contaminants CON may be released or ejected into the internal environment of the modular containment cell 100.

With the chamber cover CHC and membrane M arrangement installed, the item to be processed is thus encased or cocooned within a local environment.

Because the chamber cover CHC and membrane M may be hermetically sealed, the contaminants CON are advantageously contained within the cell. Accordingly, the contaminants CON are constrained from contaminating the internal processing chamber of the processing machine (e.g., plasma processing machine). Thus, an advantage of the present invention is that processing and/or testing of items (e.g., wafers) may be performed with realistic processing conditions, in that a containment cell encasing the item may be processed in an actual on-line semiconductor processing machine without machine/component and/or neighboring/next item contamination.

An example embodiment of the present invention may further advantageously include a fluid input/output arrangement, for controllably introducing a desired fluid (such as a gas) into the containment cell 100. As one non-limiting example, the FIGS. 1 and 2 cell body B may include an example fluid input coupling and passageway I, and a corresponding example fluid output coupling and passageway O. An input fluid $F_I$, (e.g., gas) inputted via the coupling/passageway I may be dispersed (show representatively by the FIG. 2 dashed arrows D) into the chamber CH, and may be removed (shown representatively by the collecting dashed arrows R) via the output passageway/coupling O as an output fluid $F_O$. As with the other components, any input/output components may be made of materials that do not serve as a source of contaminants.

If pressure and/or vacuum is applied to the fluid input/output arrangement, consideration may be given to the pressure and/or vacuum to avoid any breaching of the seal of the containment cell 100. For example, the pressure and/or vacuum should be maintained below the rupturing point of the membrane M, or the blow-out or suck-in points of any hermetic seals in the arrangement.

One example advantageous use of the input/output arrangement would be the delivery of processing fluid(s) to an item (e.g., wafer) loaded within the containment cell 100. For example, it may be desired to deliver an etchant or other type of gaseous or liquid chemical directly to a loaded wafer. Since the containment cell may be hermetically sealed, the fluid would not only be advantageously delivered to the wafer, but a lesser amount of the fluid may be able to be used (since it would be concentrated at the wafer), and the fluid also would be prevented from entering and possibly contaminating other areas or items of the processing machine. This is especially advantageous with dangerous and/or contaminating-type fluids.

Another example advantageous use of the input/output arrangement would be to purge contaminants from within the containment cell. More particularly, build up of a high concentration of the contaminants CON within the containment cell 100 may negatively affect continued processing within the cell. For example, build-up may inhibit or affect further chemical reactions. In this situation, a bleed gas may be introduced via the input coupling/passageway I and removed via the output passageway/coupling O. The bleed gas traveling through the chamber CH will tend to remove at least a portion of any contaminants. If it is desired that the bleed gas have no other affect on the processing or the cell, an inert gas such as helium may be used.

Figure 4:
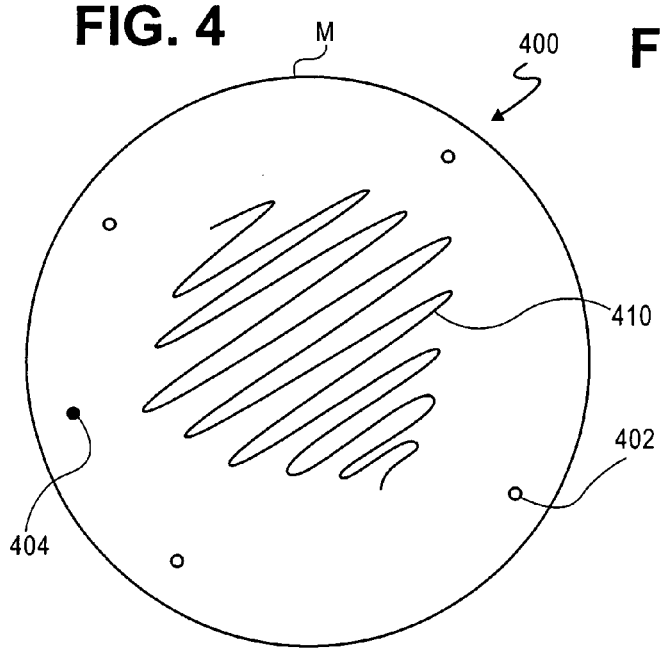
FIG. 4 is a top view of an example membrane useable with the FIG. 1 example modular containment cell arrangement.

Extending discussions further, an example embodiment of the present invention may further advantageously include contaminant capture arrangements, such that contaminants may be captured for subsequent analysis. As a first non-limiting example, the membrane M of the FIGS. 1-4 embodiments may be designed to capture and/or serve as a substrate for deposited contaminants. As example: gaseous contaminants may migrate and stick to the membrane M; splatters, eruptions might be launched and stick to the membrane M, etc. Special capture coatings on the membrane M may be an option. The membrane and any capture coating may be made of inert materials that do not affect or alter the contaminants. Once processing has been completed, the clamp screws CS and clamping ring may be removed so as to extract the membrane M, and residues thereon can then be used for contaminant analysis. FIG. 4 shows an example membrane M removed, and membrane contaminant residues are shown representatively by the FIG. 4 wavy line 410.

Another example embodiment of the present invention may further advantageously include an output trap OT (FIG. 1) designed to capture contaminants from the output fluid $F_O$ flow. More particularly, OT may be connected in-line with the output passageway/coupling O using any appropriate connection scheme (e.g., clamps, snap-on, screw on, etc). The OT may have an appropriate capture filter CF arrangement therein arranged to capture and hold the contaminants. The OT and CF components may be made of materials that do not serve as a source of contaminants, and of inert materials that do not affect or alter the contaminants.

Figure 5:
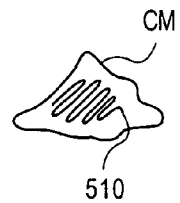
FIG. 5 is a view of an example capture material useable with the FIG. 1 example modular containment cell arrangement.

As one example, CF may be a membrane filter. As another example, CF may be an appropriate capture material CM (FIG. 5) provided in any of numerous forms, e.g., as powder, granules, tablets, etc. One option may be desorption tubes filled with an absorbent resin. Once processing has been completed, the OT and/or the CM may be removed, and residues therefrom can then be used for contaminant analysis. FIG. 5 shows an example of the CM in granular form removed from the OT, with contaminant residues shown representatively by the FIG. 5 wavy line 510.

As another alternative to capture, the OT and CF may be used for environmental concerns. For example, CF may instead be designed to neutralize dangerous components (e.g., gases) as they are exhausted to the external environment.

Figure 6:
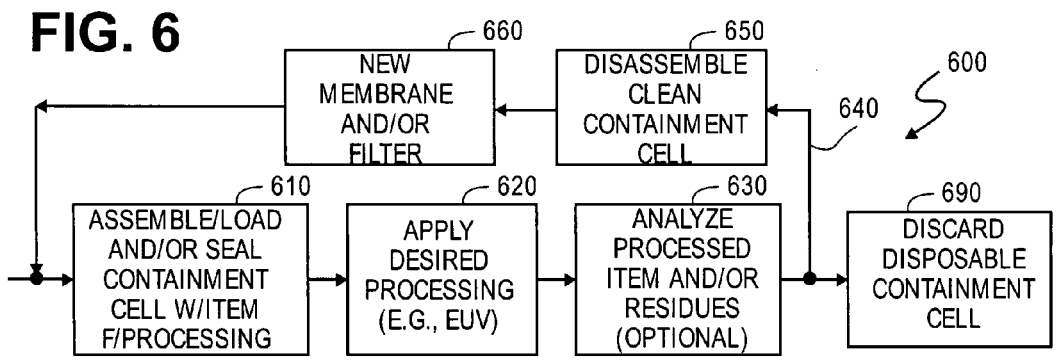
FIG. 6 is an example flow detailing example operations with respect to a modular containment cell of the present invention.

Discussion turns finally to an example implementation with an example FIG. 6 processing flow 600 and an example FIG. 3 processing system setup. More particularly, at flow block 610, there is an assembly, loading and sealing of the item for processing within the containment cell and the processing apparatus. FIG. 3's side cross-section setup 300 has an example semiconductor processing machine 310 including a processing chamber environment E, and containing the loaded FIG. 1 modular containment cell 100. The containment cell 100 may be mounted, for example, within a standard reticle holder H, and have hoses 320, 330 connected to convey the fluids $F_I$, $F_O$ to/from the cell 100. A radiation source 340 (e.g., an EUV source) is provided to apply radiation RAD through the membrane M and onto the wafer substrate S, for example, to process (FIG. 6 block 620) the aforementioned example resist material (applied to a wafer as a substrate). At block 630, there may be an optional analysis applied to any of the processed item and any residues, i.e., the used membrane M, capture filter CF and wafer substrate S may be removed for analysis.

The containment cell 100 may be advantageously reusable (FIG. 6 reuse loop 640). Ones of the clamping ring CL, chamber cover CHC and other reusable parts may be disassembled (block 650) from the main cell body B to facilitate better cleaning. The disassembled parts may thereafter be subjected to an appropriate cleaning method, for example, chemical washing, power washing, sand blasting, etc. The cleaned parts may then be reassembled (block 660) with a new membrane M, capture filter CF and wafer substrate S for new item processing (block 610). Cleaning advantageously helps minimize the risk of contamination from prior processing affecting subsequent processing. Reusability of a majority of the parts of the containment cell 100 helps minimize manufacturing and/or experimental (research) costs.

As an alternative, the containment cell 100 may be designed/manufactured to be disposable so as to avoid the responsibilities and costs of cleaning. As one example, a containment cell 100 made substantially of plastic may represent a low cost, disposable embodiment. In this instance, there is a discarding (block 690) of the disposable containment cell, rather than flow through the reuse loop 640.

Embodiments of the present invention may further include preloaded or partially-preloaded containment cells. That is, as one example, a containment cell provider may supply containment cells that are preloaded with wafers. A purchaser may apply a desired treatment (e.g., an experimental coating) to the wafer through the containment cell window WIN, and thereafter seal the window with the desired membrane M. Appropriate processing may then be applied. Again, a containment cell 100 made substantially of plastic may represent a low cost, preload embodiment.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Moreover, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

As some non-exhaustive, non-limiting examples, the containment cell is not limited to a square, rectangular or even a regular shape. Further, the processing window is not limited to a round shape. While ones of the previously-described example embodiments describe the item (substrate S) mounted on the cell body B, the item may alternatively be mounted onto the chamber cover CHC. Such may have the advantage that a bigger window may be able to be defined as the cell body is not used for item mounting. Alternative embodiments may have a different number and/or arrangement of fluid inputs and passageways. For example, inputs/outputs may be provided as part of the chamber cover CHC instead of part of the cell body B. More than one item (e.g., substrate) may be mounted within a containment cell. Further, since the containment cell prevents contamination of neighboring items, differing types of items may be able to be processed in different cells within a same processing machine. The membrane is not limited to light permeable membranes, i.e., the membrane may be selectively permeable to other types of energy and/or chemicals. Further, the membrane may be selectively permeable in a one-way direction. One example may be Gortex™. Also, it is not necessary that the containment cell or the membrane be hermetically sealed or impervious in order to contain processing materials (e.g., contaminants). For example, application of a negative (e.g., suction) pressure to the internal environment of the cell may be sufficient to contain processing materials.

What is claimed is:

1. A processing containment cell to contain an item and at least one processing material associated with processing of the item, wherein the processing containment cell comprises a removable window to allow processing conditions to pass therethrough to impinge upon the item and wherein the window comprises a polyimide membrane that allows ultraviolet (UV) light to at least partially pass therethrough.

2. A cell as claimed in claim 1, wherein the processing material includes a gas, and wherein at least one of the window and the cell is impervious to the gas.

3. A cell as claimed in claim 1, comprising removable capture medium to capture a least a portion of the processing material.

4. A cell as claimed in claim 3, wherein the capture medium is at least one of: an absorbent resin, and a micro filter.

5. A cell as claimed in claim 1, comprising a fluid input/output to at least one of introduce and remove a fluid to an internal environment of the cell.

6. A cell as claimed in claim 1, comprising a bleed system to bleed at least a portion of the processing material from the cell.

7. A cell as claimed in claim 6, comprising a removable capture medium in-line with the bleed of the processing material, to capture a least a portion of the processing material.

8. A cell as claimed in claim 1, wherein the item is a semiconductor substrate.

9. A cell as claimed in claim 1, wherein the cell has an external physical profile that is compatible to mount the cell within a predetermined reticle holder.

10. A semiconductor processing test cell to controllably contain a test item and at least one processing by-product of the test item, wherein the test cell comprises removable capture medium to capture a least a portion of the processing by-product, and wherein the capture medium is at least one of: an absorbent resin, and a micro filter.

11. A test cell as claimed in claim 10, comprising a removable window to at least one of: allow processing conditions to pass therethrough to impinge upon the test item; and, collect at least a portion of the processing by-product thereon.

12. A test cell as claimed in claim 11, wherein the window is a polyimide membrane that allows ultraviolet (UV) light to at least partially pass therethrough.

13. A test cell as claimed in claim 11, wherein the processing by-product includes a by-product gas, and wherein at least one of the window and the cell is impervious to the by-product gas.

14. A test cell as claimed in claim 10, comprising a fluid input/output to at least one of introduce and remove a fluid to an internal environment of the test cell.

15. A test cell as claimed in claim 10, comprising a bleed system to bleed at least a portion of the processing by-product from the test cell.

16. A test cell as claimed in claim 15, comprising a removable capture medium in-line with the bleed of the processing by-product, to capture a least a portion of the processing by-product.

17. A test cell as claimed in claim 10, wherein the test item is a semiconductor substrate.

18. A test cell as claimed in claim 10, wherein the test cell has an external physical profile that is compatible to mount the test cell within a predetermined reticle holder.

19. A processing method comprising:
containing an item to be processed within a containment cell to contain an item and at least one processing material associated with processing of the item;
processing while the item is contained within the containment cells,
using a bleed system of the cell to bleed at least a portion of the processing material from the cell; and
using a removable capture medium in-line with the bleed of the processing material to capture a least a portion of the processing material.

20. A method as claimed in claim 19, comprising allowing processing conditions to pass through a removable window in the containment cell to impinge upon the item.

21. A method as claimed in claim 20, wherein the window is a polyimide membrane that allows ultraviolet (UV) light to at least partially pass therethrough.

22. A method as claimed in claim 20, wherein the processing material includes a gas, and wherein at least one of the window and the cell is impervious to the gas.

23. A method as claimed in claim 19, comprising using a removable capture medium to capture a least a portion of the processing material.

24. A method as claimed in claim 23, wherein the capture medium is at least one of: an absorbent resin, and a micro filter.

25. A method as claimed in claim 19, comprising using a fluid input/output of the cell to at least one of introduce and remove a fluid to an internal environment of the cell.

26. A method as claimed in claim 19, wherein the item is a semiconductor substrate.

27. A method as claimed in claim 19, comprising using a cell that has an external physical profile that is compatible to mount the cell within a predetermined reticle holder, and mounting the cell within at least one predetermined reticle holder.

* * * * *